United States Patent [19]

Maeda

[11] Patent Number: 5,118,661
[45] Date of Patent: Jun. 2, 1992

[54] SPUTTERING TARGET FOR USE IN FABRICATING INTEGRATED CIRCUIT DEVICE

[75] Inventor: Akitoshi Maeda, Tokyo, Japan
[73] Assignee: NEC Corporation, Tokyo, Japan
[21] Appl. No.: 616,241
[22] Filed: Nov. 20, 1990

[30] Foreign Application Priority Data

Nov. 21, 1989 [JP] Japan ................... 1-304054

[51] Int. Cl.$^5$ .............. H01L 39/24; C23C 14/34
[52] U.S. Cl. .................. 505/1; 204/192.15; 204/192.17; 204/192.21; 204/192.24; 204/298.13; 204/298.12; 505/731
[58] Field of Search ........... 204/192.14, 192.15, 204/192.16, 192.17, 192.2, 192.21, 192.24, 298.12, 298.13; 505/1, 731, 816

[56] References Cited

FOREIGN PATENT DOCUMENTS

| | | | |
|---|---|---|---|
| 62-60864 | 3/1987 | Japan | 204/298.13 |
| 63-213665 | 9/1988 | Japan | 204/298.13 |
| 63-266066 | 11/1988 | Japan | 204/298.13 |
| 1-68463 | 3/1989 | Japan | 204/298.13 |

*Primary Examiner*—Aaron Weisstuch
*Attorney, Agent, or Firm*—Burns, Doane, Swecker & Mathis

[57] ABSTRACT

A sputtering target for forming a thin film of an alloy on a substrate includes a first component having a first mass number and a second component having a second mass number larger than the first mass number. The weight percentage of the first component increases with depth from the surface of the target.

23 Claims, 4 Drawing Sheets

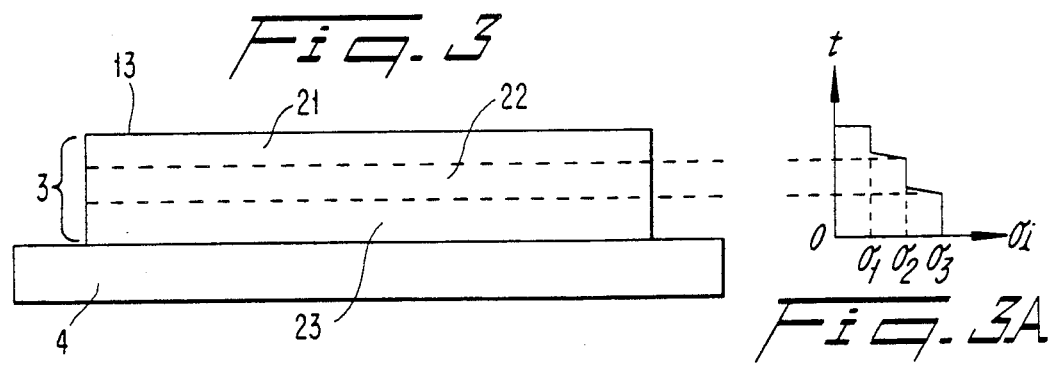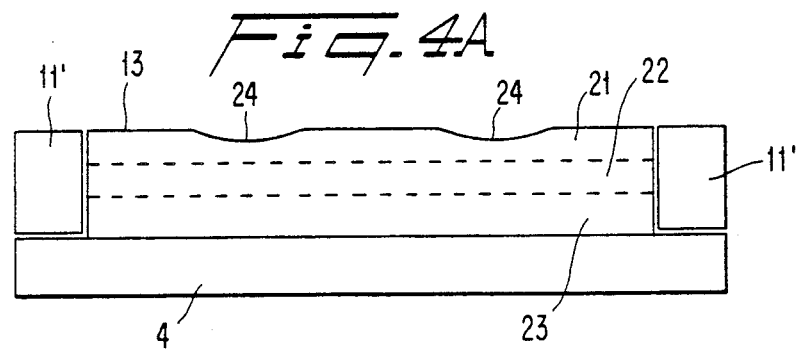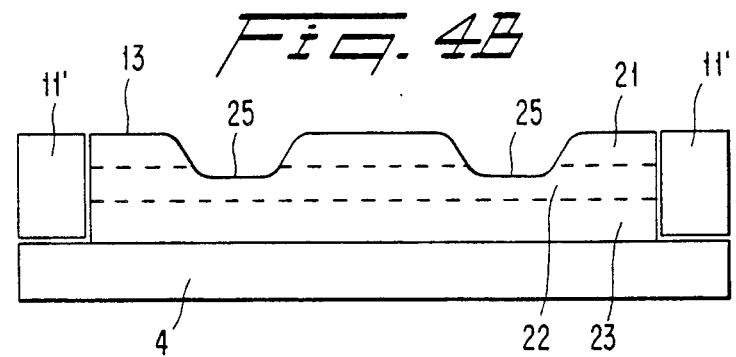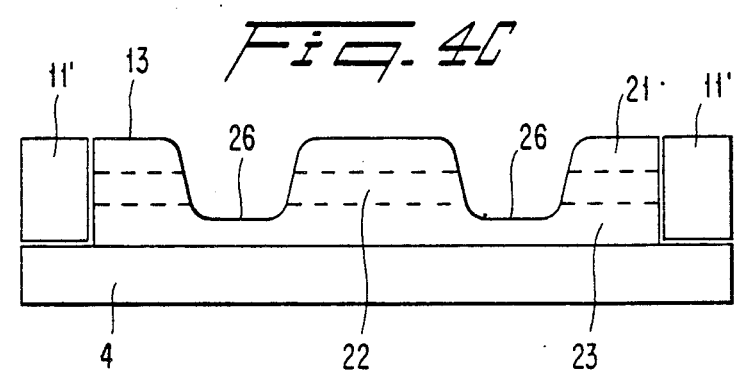

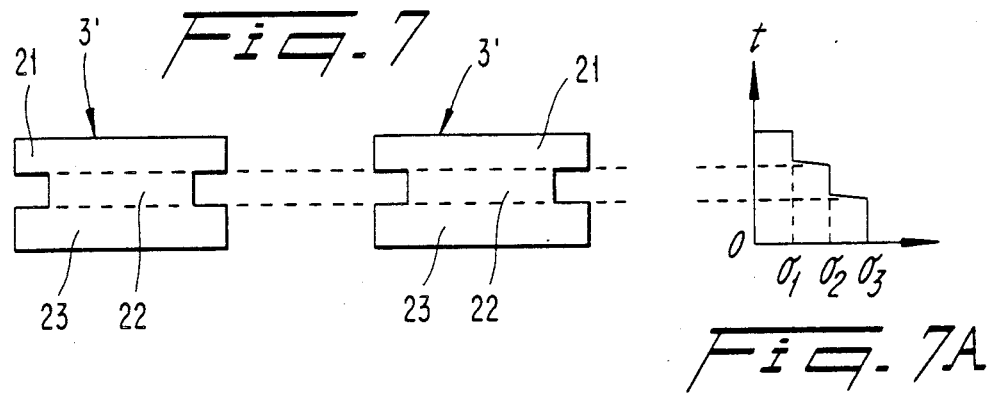
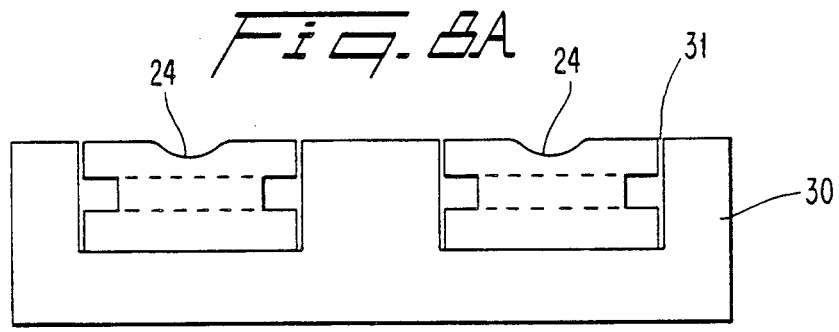
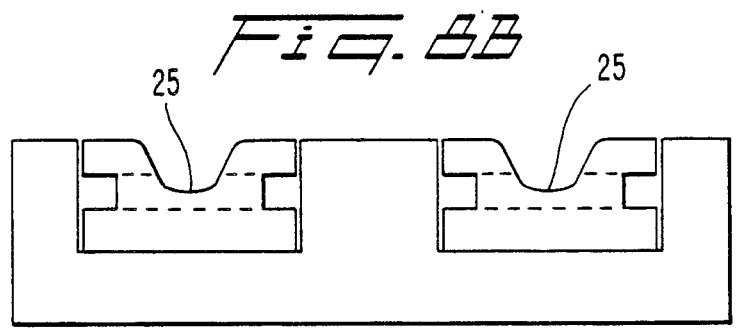

SPUTTERING TARGET FOR USE IN FABRICATING INTEGRATED CIRCUIT DEVICE

BACKGROUND OF THE INVENTION

1. Field of the Invention

This invention relates to a sputtering target for use in fabricating an integrated circuit (IC) device, and more particularly, to a sputtering target for forming a thin film of an alloy.

2. Description of Related Art

Thin films of alloys deposited by the sputtering technique are widely used as electrode or wiring materials, diffusion barriers and thin-film resistors of semiconductor IC devices and other IC devices.

For example, as materials for electrodes of MOSICs there are used in many cases polycides each comprising polycrystalline silicon and thereon a silicide of a high melting point metal such as tungsten silicide (WSi), molybdenum silicide (MoSi), and titanium silicide (TiSi). Thin films of alloys such as WSi, MoSi and TiSi are formed by the sputtering process including depositing an alloy material on a substrate by using it as a target.

Likewise, diffusion barriers are often formed in the form of a thin film of an alloy such as titaniumtungsten (Ti-W) by sputtering a target of the alloy. For a specified use, a thin film resistor of siliconchromium (CrSi) also may be formed by sputtering a target of the alloy.

The term "sputtering process" used herein means a process wherein: An inert gas such as argon (Ar) is supplied at a background pressure of a few millitorr into a chamber maintained at a high vacuum of usually about $1 \times 10^{-7}$ torr, and subjected to DC-discharge. The produced argon ions (Ar+) strike a target mounted on the cathode, whereby target atoms are sputtered therefrom, and eventually deposited as a thin metal film onto an oppositely-disposed substrate.

An alloy target suitable for use in the above-mentioned process can be prepared generally by uniformly mixing powdered components of the alloy of a high purity and sintering the mixture under specified conditions of temperature, pressure and atmosphere, or melting it by using an electron beam. The thus-obtained target is homogeneous and its composition is uniform throughout.

In the above-mentioned targets in the prior art, however, there is encountered a problem that during the course of forming a film by sputtering with such a target as mentioned above, the composition of the thin film formed on the substrate varies as the target wears away, resulting in poor characteristics and quality of products.

The above-mentioned phenomenon that a film is being formed with its composition varying can be explained by the following exemplification: With a two-component alloy target whose components are elements greatly different in mass number, such as WSi, MoSi, TiSi, TiW or CrSi (Ratio of the mass numbers is about W/Si 6.5, Mo/Si = 3.4, Ti/Si = 1.7, W/Ti = 3.8, and Cr/Si 1.9, respectively), one component of smaller mass number, compared with the other larger mass number, tends to undergo scattering resulting from collisions with argon ions on the way from to the target to the substrate, and accordingly the thin film formed on the substrate becomes different in composition from the target, and thus the amount of the component of smaller mass number in the formed film lowers.

As the target wears away, erosion becomes deeper, and the distance of sputtered particle travel to the substrate becomes longer. On the other hand, the mean free path of Ar+ is the same if pressure and temperature remained unchanged. It follows that the prolonged distance contributes to increasing the number of collisions, and the more easily the smaller mass number component undergoes scattering. With a homogeneous target, therefore, the composition of a film formed on a substrate varies so that the amount of the smaller atomic mass number component decreases as the target wears away. It has been found from studies by the inventor that with Ti-W as a target in which 10 wt % Ti is uniformly contained, the weight percent of the smaller mass number component (Ti) in a thin film formed on a substrate using the sputtering target in the last stage of erosion was lowered by 30 to 40% by weight compared with the amount of Ti in another thin film formed on another substrate using the same sputtering target in the initial stage of erosion. FIG. 6 shows an example of the data obtained, in which the datum indicated by A is of the initial target stage and the datum indicated by B is near the last target stage after erosion.

As described above, with a homogeneous target in the prior art, the composition of an actually-formed film on a substrate varies considerably with the progress of erosion of the target. In particular, the greater the ratio between mass numbers of components of the target is, this tendency appears more remarkably, reflecting various defects: For example, electrodes made from WSi, MoSi or TiSi may suffer peeling and swelling after thermal treatment. Diffusion barriers from TiW may result in poor heat resistance. As for thin film resistors made from CrSi, problems with stability of the resistance value may arise. This leads to impairment in yield and reliability of products.

The phenomenon is considered to be the same in a thin film of a three or more component alloy deposited by using a three or more component alloy target.

When a superconductive thin film of an alloy of La (lanthanum) - Ba (barium) Cu (copper) - O (oxygen), of La - Sr (strontium) Cu - O, or of Y (yttrium) - Ba - Cu - O, etc. is formed on a substrate by sputtering using the same composition alloy target, the weight percent of the component O (oxygen) to the total weight, of which the O (oxygen) mass number is the smallest of the components, is varied between the initial stage to the last stage of the target, thereby unfavorably changing the critical temperature of the superconductive thin film.

SUMMARY OF THE INVENTION

Accordingly, it is an object of the present invention to provide a sputtering target by which the composition of films sputter deposited therefrom does not vary substantially or scarcely varies with the progress of erosion of the target.

According to the present invention, there is provided a sputtering target for forming a thin film of an alloy on a substrate such as a substrate of IC devices. The sputtering target has a major surface from which sputtering by collision with ions is commenced, and includes a first component having a first mass number and a second component having a second mass number larger than the first mass number. A composition gradient in the direction of depth is such that the weight percent of the first component increases with depth from the major surface of the target.

BRIEF DESCRIPTION OF THE DRAWINGS

FIG. 3 is a cross-sectional view schematically showing a first embodiment of the present invention, and FIG. 3A is a graph showing the relation between the depth of the target and the weight percent of the component of smaller mass number in FIG. 3;

FIGS. 4A to 4C are cross-sectional views schematically showing the target of the first embodiment shown in FIG. 3 in different stages of erosion thereof;

FIG. 7 is a cross-sectional view schematically showing a second embodiment of the present invention, and FIG. 7A is a graph showing the relation between the depth of the target and the weight percent of the component of smaller mass number in FIG. 7; and FIGS. 8A and 8B are cross-sectional views schematically showing the target of the second embodiment shown in FIG. 7 in different stages of erosion thereof.

DESCRIPTION OF THE PREFERRED EMBODIMENTS

Figure 1:
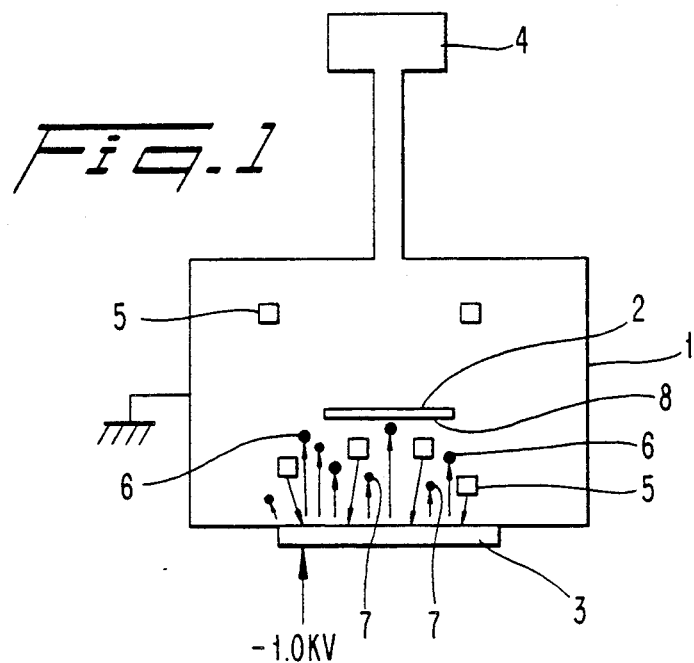
FIG. 1 is a drawing illustratively showing a sputtering process.

Referring to FIG. 1, a sealed chamber 1 is connected to a vacuum pump 4 and is electronically grounded. To a sputtering target 3 of Ti (titanium) - W (tungsten) alloy mounted on a cathode, a negative voltage ($-1.0$ Kv) is applied at an argon pressure within the chamber 1 of 8 mm Torr., thereby producing a DC-discharge. The produced argon ions (Ar$^+$) 5 indicated by a white square ($\square$) strike the surface of the target 3 as shown by the arrows. Therefore, target atoms consisting of Ti atoms 7 indicated by a small black circle (.) and W atoms 6 indicated by a large black circle (•) are sputtered from the target to the substrate as shown by the respective arrows, and these atoms are deposited as a thin metal film 8 of Ti-W alloy on a major surface of a semiconductor wafer 2.

Figure 2:
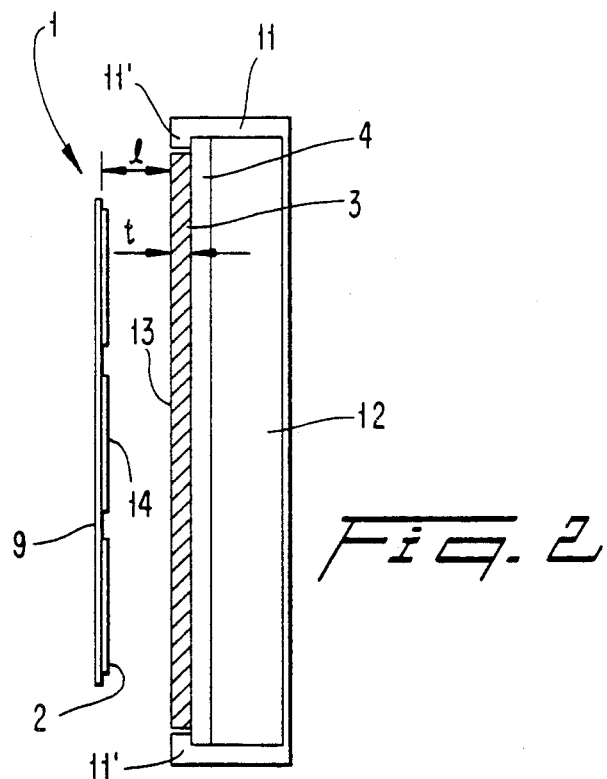
FIG. 2 is a cross-sectional view schematically showing a relation between a sputtering target and semiconductor wafers on which thin films of alloy are formed.

Referring to FIG. 2, the cathode includes the sputtering target 3 bonded to a target back plate 4 made of copper, and in turn the back plate 4 is supported and sealed by a target support member 11 made of stainless steel so that a cavity 12 in which coolant water flows is formed. The portion 11′, of the support member 11 acts as shielding. The semiconductor wafers 2 are installed on a holder 9 in the chamber 1. The target 3 has a thickness (t) of 9.5 mm, and the distance (l) between the surface 14 of the semiconductor wafer 2 and the surface 13 of the target 3 is 40mm.

Referring to FIG. 3, the sputtering target 3 has a rectangular plan shape of 121 mm × 378 mm, and a total thickness of 9.5 mm. The major surface 13 is planar at the initial state of the target (i.e., the unused state), and the target 3 is bonded to the back plate 4 of copper at the other major surface. The target 3 is of an alloy such as Ta-Si, Mo-Si, Ti-Si, Ti-W, Cr-Si, La-Ba-Cu-O, La-Sr-Cu-O, or Y-Ba-Cu-O.

The composition of this planar target 3 is not uniform but has a stepwise gradient of composition in the depthwise direction as shown in FIG. 3A. Letting the thickness of the target be "t", it divides into three layers: the top layer 21 having a thickness of t/4 to t/3 from the collision surface 13 and a weight percent $\sigma1$ of the smaller mass number component, the middle layer 22 having a thickness of the next t/4 to t/3 and a weight percent $\sigma2$, and the bottom layer (remaining to the back plate 4) 23 having a thickness of t/3 to t/2 and a weight percent of $\sigma3$. Herein these weight percents are in the interrelationship of $\sigma1 < \sigma2 < \sigma3$.

$\sigma1$, $\sigma2$ and $\sigma3$ are the weight percent of the smaller mass number component relative to the total weight of the alloy of the target, and the smaller mass number component is Si in the case of W-Si alloy, Si in the case of Mo-Si alloy, Si in the case of Ti-Si alloy, Ti in the case of W-Ti alloy, Si in the case of Cr-Si alloy, Si in the case of Ta-Si alloy, O (oxygen) in the case of La-Ba-Cu-O alloy, O (oxygen) in the case of La-Sr-Cu-O alloy and O (oxygen) in case of Y-Ba-Cu-O alloy, respectively.

For example, when a Ti-W thin film 8 having 10 Wt. % Ti relative to the total weight (Ti being smaller in mass number than W) is formed on the semiconductor substrate, the percent $\sigma1$ of Ti in the top layer 21 of the target 3 is set to about 12 Wt. %; the percent $\sigma2$ of Ti in the middle layer 22 of the target 3 is set to about 14 Wt. %; and the percent $\sigma3$ of Ti in the bottom layer 23 of the target 3 is set to about 16 Wt. %. Generally, suitable values of $\sigma2/\sigma1$ and $\sigma3/\sigma1$ for a target vary with the kinds of components in it.

It is necessary for the preparation of such an alloy target firstly to make three mixtures, in which the percentages of the smaller mass number are $\sigma1$, $\sigma2$ and $\sigma3$, respectively, by homogeneously mixing powders of previously highly-purified component materials, followed by laminating the mixtures in sequence, and then sintering the laminate at proper temperature and pressure in an inert atmosphere. If more density and higher purity are required, another process of melting in vacuo by using an electron beam may be performed. In this process, if the target is molten as a whole, uniform composition will result, and therefore it is necessary to perform the melting and solidification stepwise, for example, in the sequence of the first or top layer 21→ the second or middle layer 22→ the third or bottom layer 23, and to control the energy of electron beam so that mutual diffusion in the borders between the layers is reduced. In the prior art, a plurality of alloy targets can be obtained from an ingot manufactured by sintering or melting whereas a target according to the present invention can be prepared only in a distinct way.

FIGS. 4A to 4C show erosion stages of the target 3. The target 3 shown in FIG. 3 is mounted on the cathode in the sputtering apparatus as shown in FIGS. 1 and 2. The target 3 is backed with a plate 4 which is water cooled at the rear. In addition, on the rear side of the back plate 14 there is usually provided a magnet (not shown) for the concentration of Ar$^+$ to improve sputtering rate and to permit the erosion area to be extended evenly.

FIG. 4A shows the erosion state 24 of the target 3 in an early stage of erosion where only the top layer 21 of composition $\sigma1$ is eroded. FIG. 4B shows the erosion state 25 in the next stage of composition erosion wherein additionally the middle layer 22 of $\sigma2$ is eroded. FIG. 4C shows the erosion state 23 in the last stage of erosion wherein erosion 26 has reached the bottom layer 23 of composition $\sigma3$. With deeper extension of the erosion area under the condition $\sigma1 < \sigma2 < \sigma3$, the smaller mass number component is sputtered at a gradually-increased rate, and this enables formation of a film on the semiconductor wafer whose composition is substantially uniform.

Figure 5:
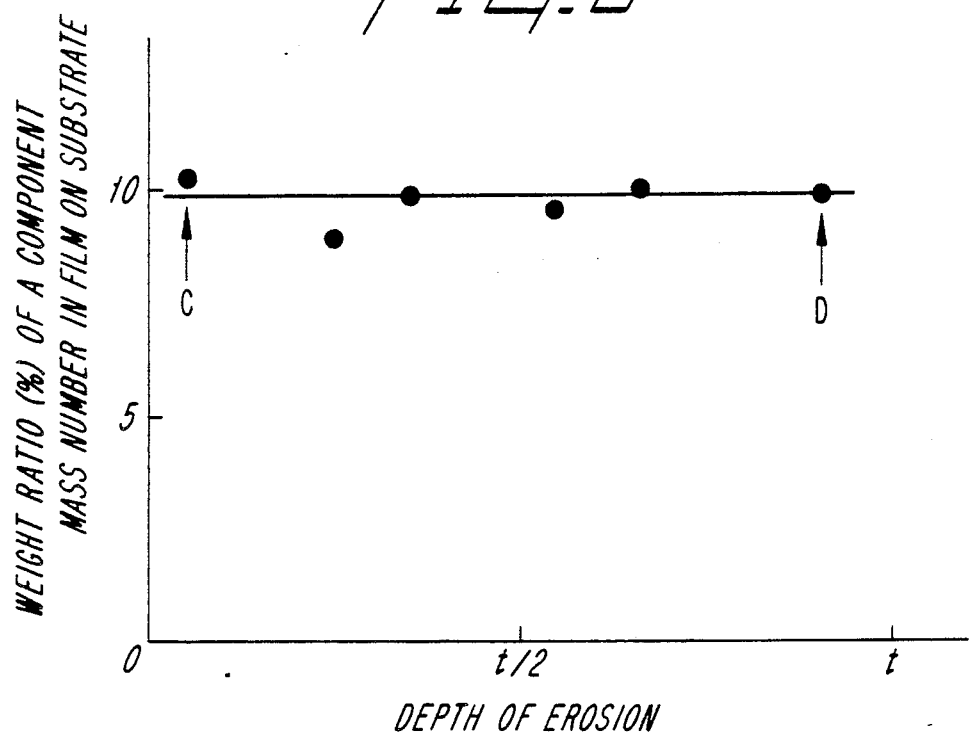
FIGS. 5 and 6 show the relationships between the depth of erosion and the composition of the film formed on the substrate using a target according to the first embodiment of the present invention and a target of the prior art, respectively.
Figure 6:
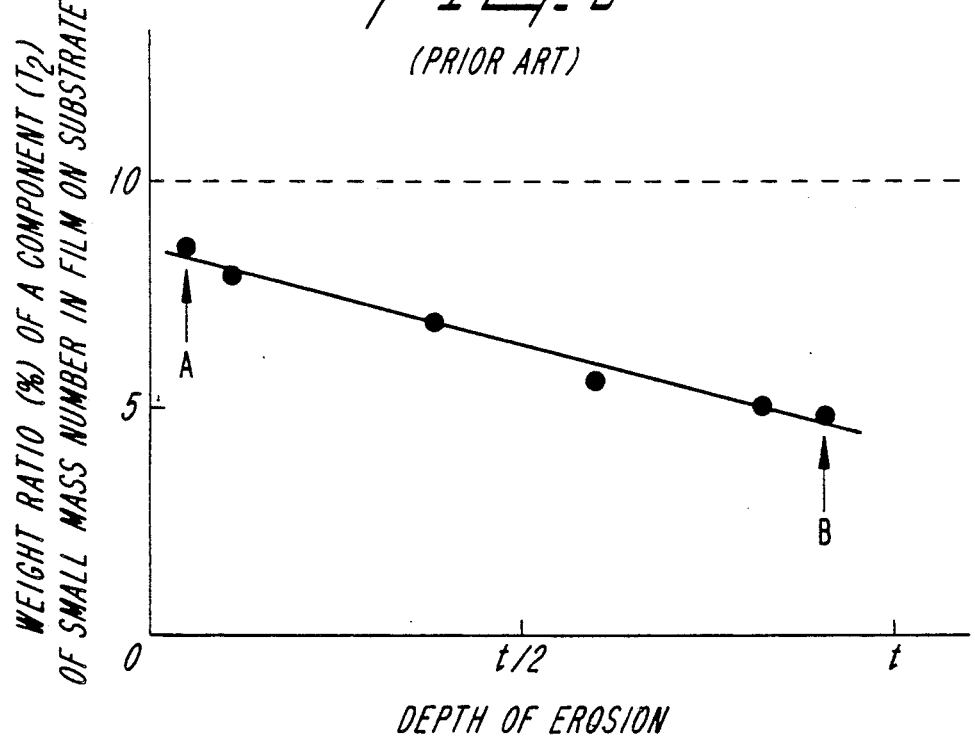

FIG. 5 shows as an example the relationship, when a target of TiW according to the present invention is used, between erosion stage of the target (that is, depth of erosion) and the composition of the films formed on the semiconductor wafers at this stage (expressed by the weight percent of the smaller mass number component (Ti)). The composition of the film which is constant from the datum indicated by C (initial stage) to the datum indicated by D (near the last stage) compared with that in the prior art shown in FIG. 6.

Referring to FIGS. 7, 7A, 8A and 8B, a second embodiment of the present invention will be explained. In FIGS. 7 and 8, the same components as those in FIGS. 1 to 4 are indicated by the same reference numerals and signs. In the embodiment, the target 3' has a rectangular plan shape of 40 mm × 375 mm, and a total thickness of 13.5 mm. The targets 3, are inserted into holes 31; respectively, formed in a cathode 30 without bonding to a back plate, and fixed by screw means (not shown). Although not shown in the drawings, the cathode 30 is cooled by water and magnet means is provided as explained in the first embodiment. Both embodiments have the same advantages.

As mentioned above, the present invention can be applied to a sputtering target of magnetic material such as cobalt-chromium (Co-Cr). Besides it is a matter of course that the structure composed of three layers 21, 22, 23 having different compositions in the example described above is not limiting but other multilayered structures including two-layered structure may be applied.

As described above, the feature of the present invention resides in the aspect that a sputtering target of an alloy is prepared in such a way that the weight percent of the smaller mass number component is higher with increasing depth from the collision surface. Thereby, the present invention affords the advantage that a deposited film substantially uniform in composition independent of the extent of erosion of the target can be obtained, and this enables one to improve yield and quality of product.

What is claimed is:

1. A sputtering target for forming a thin film of an alloy on a semiconductor substrate, said target comprising a first major surface from which collision of ions is commenced and a second major surface, and including a first component having a first mass number and a second component having a second mass number larger than said first mass number, the weight percentage of said first component increasing with depth from said first major surface toward said second major surface, and said target including a top layer constituting said first major surface of said target, a middle layer under said top layer and a bottom layer under said middle layer such that said middle layer is higher than that in said top layer and that said weight percentage of said first component of said bottom layer is higher than that in said middle layer.

2. A sputtering target of claim 1, in which the thickness of said top target layer is 166 to ¼ of the total thickness of said target; the thickness of said middle layer is ⅓ to ¼ of said total thickness of said target; and the thickness of said bottom layer is ⅓ to ½ of said total thickness of said target.

3. A sputtering target of claim 1, in which said target is bonded to a back plate at said second major surface.

4. A sputtering target of claim 1, in which said target is set in a hole formed in a cathode.

5. A sputtering target of claim 1, in which said first component is silicon and said second component is tungsten.

6. A sputtering target of claim 1, in which said first component is silicon and said second component is molybdenum.

7. A sputtering target of claim 1, in which said first component is silicon and said second component is titanium.

8. A sputtering target of claim 1, in which said first component is silicon and said second component is chromium.

9. A sputtering target of claim 1, in which said first component is silicon and said second component is tantalum.

10. A sputtering target of claim 1, in which said first component is titanium and said second component is tungsten.

11. A sputtering target of claim 1, said target further including a third component having a third mass number larger than said first mass number and a fourth component having a fourth mass number larger than said first mass number, and in which said thin film to be formed on said substrate is a superconductive film.

12. A sputtering target of claim 11, in which said first component is oxygen; said second component is lanthanum; said third component is barium; and said fourth component is copper.

13. A sputtering target of claim 11, in which said first component is oxygen; said second component is lanthanum; said third component is strontium; and said fourth component is copper.

14. A sputtering target of claim 11, in which said first component is oxygen; said second component is yttrium; said third component is barium; and said fourth component is copper.

15. A sputtering target for forming a thin film of an alloy on a semiconductor substrate, said target having a first major surface from which collision of ions is commenced and a second major surface, and including silicon and a high melting point metal in a form of an alloy, said high melting point metal being selected from a group consisting of tungsten, molybdenum, titanium, chromium and tantalum, the weight percentage of said silicon increasing with depth from said first major surface to said second major surface.

16. A sputtering target of claim 15, in which said target includes a top layer constituting said first major surface of said target, a middle layer under said top layer and a bottom layer under said middle layer such that said weight percentage of said silicon in said middle layer is higher than that in said top layer and that said weight percentage of said silicon in said bottom layer is higher than that in said middle layer.

17. A sputtering target of claim 16, in which the thickness of said top layer is ⅓ to ¼ of the total thickness of said target; the thickness of said middle layer is ⅓ to ¼ of said total thickness of said target; and the thickness of said bottom layer is ⅓ to ½ of said total thickness of said target.

18. A sputtering target for forming a thin film of an alloy on a semiconductor substrate, said target having a first major surface from which collision of ions is commenced and a second major surface, and including titanium and tungsten in a form of an alloy, the weight percentage of said titanium increasing with depth from said first major surface to said second major surface.

19. A sputtering target of claim 18, in which said target includes a top layer constituting said first major surface of said target, a middle layer under said top layer and a bottom layer under said middle layer such that said weight percentage of said titanium in said bottom layer is higher than that in said middle layer.

20. A sputtering target of claim 19, in which the thickness of said top layer is $\frac{1}{3}$ to $\frac{1}{4}$ of the total thickness of said target; the thickness of said middle layer is $\frac{1}{3}$ to $\frac{1}{4}$ of said total thickness of said target; and the thickness of said bottom layer is $\frac{1}{3}$ to $\frac{1}{2}$ of said total thickness of said target.

21. A sputtering target for forming a superconductive thin film of an alloy on a semiconductive substrate, said target having a first major surface from which collision of ions is commenced and a second major surface, and comprising an alloy selected from the group of oxygen-lanthanum-barium-copper, oxygen-alnthanum-strontium-copper, and oxygen-yttrium-barium-copper, the weight percentage of said oxygen increasing with depth from said first major surface to said second major surface.

22. A sputtering target of claim 21, in which said target includes a top layer constituting said first major surface of said target, a middle layer under said top layer and a bottom layer under said middle layer such that said weight percentage of said oxygen in said middle layer is higher than that in said top layer and that said weight percentage of said oxygen in said bottom layer is higher than that in said middle layer.

23. A sputtering target of claim 22, in which the thickness of said top layer is $\frac{1}{3}$ to $\frac{1}{4}$ of the total thickness of said target; the thickness of said middle layer is $\frac{1}{3}$ to $\frac{1}{4}$ of said total thickness of said target; and the thickness of said bottom layer is $\frac{1}{3}$ to $\frac{1}{2}$ of said total thickness of said target.

* * * * *